United States Patent [19]

Triplett

[11] 4,259,635

[45] Mar. 31, 1981

[54] ELECTRICAL CONTINUITY AND VOLTAGE TESTING DEVICE HAVING A PAIR OF PROBES SPACED FOR INSERTION INTO AN ELECTRICAL SOCKET

[76] Inventor: William R. Triplett, c/o Bluffton Products, Inc., P.O. Box 87, Bluffton, Ohio 45817

[21] Appl. No.: 46,854

[22] Filed: Jun. 8, 1979

[51] Int. Cl.³ .................. G01R 1/06; G01R 1/04; G01R 1/06
[52] U.S. Cl. ............................. 324/149; 324/51; 324/72.5; 324/156
[58] Field of Search .............. 324/51, 72.5, 133, 149, 324/156

[56] References Cited

U.S. PATENT DOCUMENTS

| | | | |
|---|---|---|---|
| 2,581,497 | 1/1952 | Podell | 324/149 X |
| 3,555,420 | 1/1971 | Schwartz | 324/149 |
| 3,757,218 | 9/1973 | Oliverio et al. | 324/149 X |
| 3,840,808 | 10/1974 | Liebermann | 324/149 X |
| 3,987,364 | 10/1976 | MacCormack et al. | 324/51 |
| 4,015,201 | 3/1977 | Chaffee | 324/149 X |
| 4,079,314 | 3/1978 | Jone | 324/149 |

*Primary Examiner*—Gerard R. Strecker
*Attorney, Agent, or Firm*—Richard L. Miller

[57] ABSTRACT

An electrical instrument that includes two probes extending therefrom for contacting various points of other electrical devices being checked; the instrument including a case containing an electrical circuit between the probes, the circuit including a battery, switch and indicator lamp, and one of the probes being on an extension cord that winds up around the case for storage and in which position the probes align adjacent to each other for fitting in an electric outlet socket and the like.

1 Claim, 6 Drawing Figures

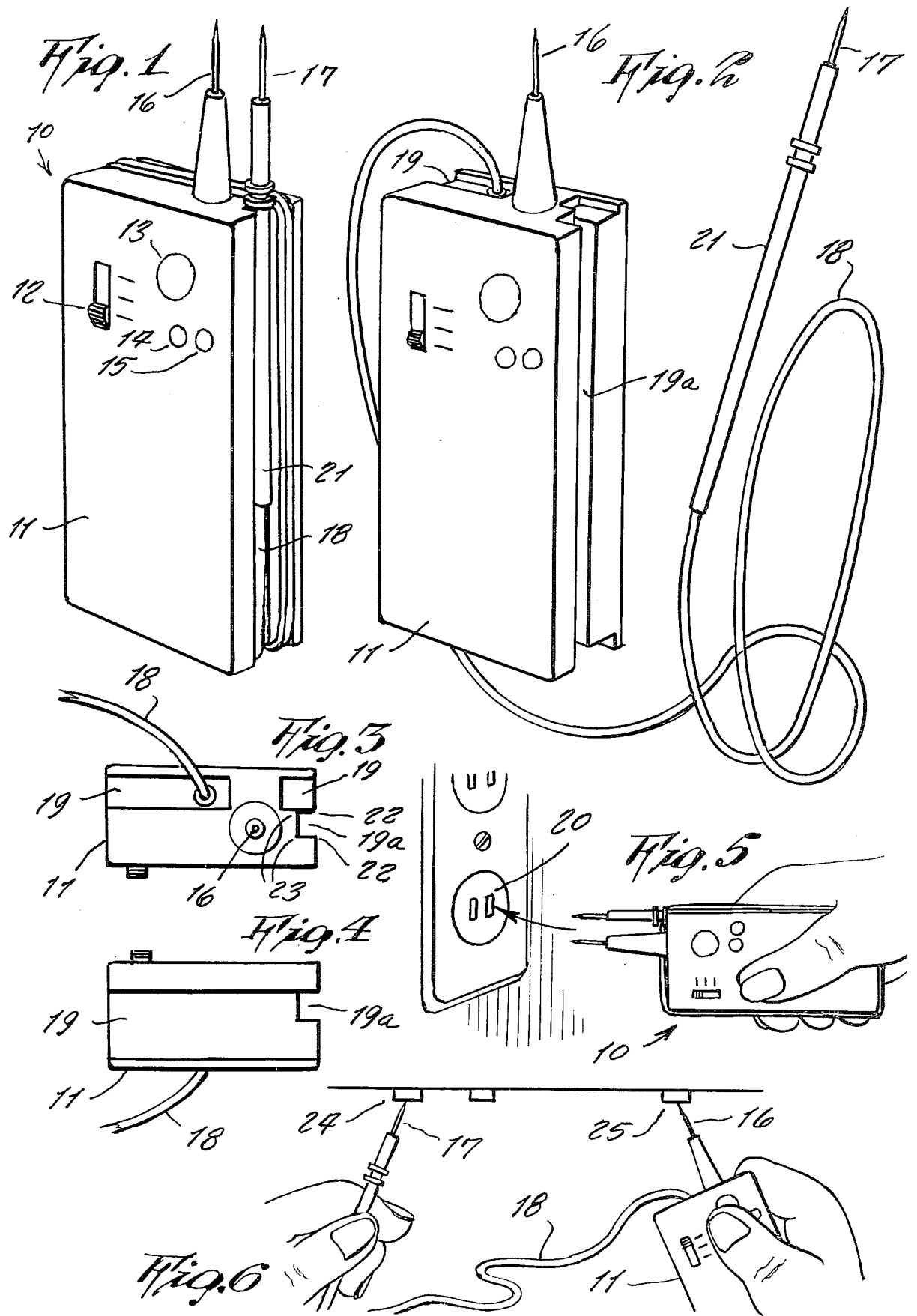

ELECTRICAL CONTINUITY AND VOLTAGE TESTING DEVICE HAVING A PAIR OF PROBES SPACED FOR INSERTION INTO AN ELECTRICAL SOCKET

BACKGROUND OF THE INVENTION

This invention relates generally to electrical testing instruments. Heretofore electrical testing instruments have been generally made with a pair of probes on the ends of two extension cords which must each be separately held in every use of the instrument, so that both hands are occupied therewith. Very often a test requires applying the two probes against electrical contacts which are a standard fixed distance apart, such as the contacts inside a wall electric outlet socket. It seems impractical that both hands must be employed for such applications, whereas one hand alone could do it if the probes were a fixed distance apart, so as to free the other hand for other use.

SUMMARY OF THE INVENTION

Therefore, it is a principal object of the present invention to provide an electrical testing instrument wherein the two probes can be held in two hands for engaging in contacts at odd distances apart, or else both probes can be held in one hand, fixedly respective to each other for engaging contacts at standard distances apart.

Another object is to provide an electrical continuity and voltage testing device which can comprise any type of specific instrument incorporating the above-described probe features.

Further objects of the invention will appear as the description proceeds.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING

The Figures on the drawings are briefly described as follows:

FIG. 1 is a perspective view of the instrument shown with the movable probe in a stored position, clipped on the case.

FIG. 2 is a similar view with movable probe shown unclipped from the case.

FIG. 3 is a top view of the case.

FIG. 4 is a bottom view thereof.

FIG. 5 shows the instrument in use when in a position as shown in FIG. 1.

FIG. 6 shows the instrument in use when in a position as shown in FIG. 2.

DETAILED DESCRIPTION OF PREFERRED EMBODIMENT

Referring now to the drawing in greater detail, the reference numeral 10 represents an electrical continuity and voltage testing device according to the present invention, wherein there is a case 11 molded preferably of type of electrical circuit, depending upon the intended purposes of the instrument. Accordingly, in the example illustrated, it may contain a switch 12, a plurality of indicator lamps 13, 14 and 15, as well as a dry cell battery and circuitry connected between probes 16 and 17. Probe 16 is rigidly affixed upon one end of the case, so that the case serves as a handle therefor.

The other probe 17 is affixed upon an end of a flexible extension cord 18 so that the probe 17 can be moved respective to the probe 16 when engaging contacts of any odd distance apart.

The case includes a groove 19 that extends at least partially all around the outer side of the case, so that the extension cord can be wound up therein when not needed. The size of the case, the depth of the groove and length of the extension cord attached to the case are such, so that when the extension cord is fully wound up in the groove around the case and the probe 17 aligns parallel adjacent to probe 16 at a specific distance away, so that the two probes are suitable for use in engaging contacts of standard specific distance apart, such as the contacts inside an ordinary household electric outlet socket 20, or the like.

It is to be noted that the portion 19a of the groove which receives a rigid, hard plastic handle 21 of the probe 17, is made with the outer edge corners 22 thereof slightly closer together than the inner corners 23, so that the handle 21 snap fits into the groove portion 19. Thus, the extension cord is retained in wound up position around the case.

In the wound up position, the instrument is used to check contacts inside a wall electric outlet socket 20, as shown in FIG. 5. When the extension cord is unwound, as shown in FIG. 6, then contacts 24 and 25, far apart from each other, can be contacted.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. An electrical testing device, comprising in combination, a case, an electrical circuit inside said case, said circuit extending between a pair of exterior probes, a first of said probes being rigidly affixed to said case, and a second of said probes being on an end of a flexible uncoiled extension cord extending from said case, a groove extending around an outer side of said case, said extension cord fitting into said groove when wound around said case, receiving means on said case for inflexibly holding said probe to said case in an operational position parallel to said first probe and spaced therefrom a distance equal to the spacing of the contacts of an electrical socket, whereby said testing device can be used both with the cord wound and the second probe held to the case as well as with the cord unwound and the second probe extended from the cord, said second probe including a rigid elongated handle, said receiving means comprising an elongated groove formed along one side of the case, the mouth of the groove being slightly narrower than the handle to provide a snap fit of the handle in the elongated groove, so as to maintain the handle rigidly positioned parallel to the case and to prevent flexible movement of the handle when in said elongated groove, said handle including a shoulder portion which abuts against the case when the handle is positioned in the elongated groove and is located at a position on said handle such that the second probe extends substantially the same distance from the case as said first probe for maintaining the proper positioning of the second probe with respect to the first probe, and wherein said uncoiled extension cord is of such a length that when wound around said case groove, the entire length of the cord is utilized without any unused slack portion and without disturbing the locating of the shoulder portion on the case.

* * * * *